(12) United States Patent
Chang

(10) Patent No.: US 6,838,314 B2
(45) Date of Patent: Jan. 4, 2005

(54) SUBSTRATE WITH STACKED VIAS AND FINE CIRCUITS THEREON, AND METHOD FOR FABRICATING THE SAME

(75) Inventor: Ruei-Chih Chang, Hsinchu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 10/651,886

(22) Filed: Aug. 29, 2003

(65) Prior Publication Data

US 2004/0124535 A1 Jul. 1, 2004

(30) Foreign Application Priority Data

Dec. 31, 2002 (TW) .......................................... 91137958 A (51) Int. Cl.⁷ .................... H01L 21/44; H01L 21/48; H01L 21/50; H01L 21/82; H01L 21/8763
(52) U.S. Cl. .................... 438/106; 438/125; 438/622; 438/652
(58) Field of Search .................... 438/106–112, 125, 438/622, 652, 678; 216/13; 427/96; 428/206, 209; 174/250, 255; 361/748–753; 205/125; 257/276, 621, 685–686, 698, 700

(56) References Cited

U.S. PATENT DOCUMENTS 4,915,983 A * 4/1990 Lake et al. .................... 427/98
5,080,958 A * 1/1992 Patterson et al. ............ 428/209
6,261,671 B1 * 7/2001 Asai et al. .................... 428/206
6,376,052 B1 * 4/2002 Asai et al. .................... 428/209
6,534,723 B1 * 3/2003 Asai et al. .................... 174/255
2002/0056192 A1 * 5/2002 Suwa et al. .................... 29/847
2002/0131247 A1 * 9/2002 Cooray ....................... 361/750
2002/0152611 A1 * 10/2002 Tung et al. .................... 29/846

\* cited by examiner

*Primary Examiner*—Shouxiang Hu
(74) *Attorney, Agent, or Firm*—Fulbright & Jaworski L.L.P.

(57) ABSTRACT

A substrate with stacked vias and fine circuits and a method for fabricating the substrate are proposed. A core layer is formed with a metal layer respectively on upper and lower surfaces thereof, and at least one through hole. A first insulating layer is applied over the metal layer on the upper surface of the core layer and selectively formed with at least one first opening for exposing the metal layer. A metal layer is formed within the first opening, and a second insulating layer is applied over the first insulating layer and formed with a plurality of second openings, wherein the metal layer within the first opening is exposed via at least one second opening. After a conductive layer is applied over the second insulating layer and within the second openings, a metal layer is formed within the second openings. Finally, the conductive layer is removed by micro-etching.

5 Claims, 9 Drawing Sheets

120
SUBSTRATE WITH STACKED VIAS AND FINE CIRCUITS THEREON, AND METHOD FOR FABRICATING THE SAME

FIELD OF THE INVENTION

The present invention relates to substrates of semiconductor packages, and more particularly, to an unsymmetrical multilayer circuit board having a build up layer on a single surface of a core layer thereof, and a method of making the same.

BACKGROUND OF THE INVENTION

As portable electronic devices are growing and are used in a wide variety of field such as in communication, internet and computer, semiconductor packages with high integrated circuits, smaller size and multi-leads such as those of BGA structure, flip chip structure, chip size package (CSP) and multichip module (MCM) are becoming more favorable. They are often incorporated with chips of high functionality such as microprocessors, multichip module, or drafting chips so as to perform instructions in higher speed. However, the manufacturing process for forming IC substrates of high I/O is often constrained as to assure preferable signal transmissions, improved bandwidth and resistance control and also the manufacturing process of the substrate occupies 20% to 50% of the total manufacturing cost. Thus as the production of 0.09 μm integrated circuits is achieved and the package size is also continuously decreasing to almost about the same size as the chip (approximately 1.2 times larger than the chip), the development of substrate with fine circuits, high densities and small through holes, allowing fewer stacked layers can be formed thereon but yet the manufacturing cost is not necessary increased has not doubt become one of the major issue for the IC industry or other the electronic related industries for the next generation.

Low cost, high reliability and high density are always the goals for achieving in the IC industries. In order for achieving goals, a build-up technology is developed. This build-up technology is characterized by forming multiple insulating layers and conductive layers, alternately stacked on a core layer and subsequently forming a plurality of via holes on each of the insulating layers to form electrical connection between each conductive layers. However, the number of build-up circuit boards can be substantially increase to over 10 or 20 layers. This build-up technology has been used very widely in manufacturing different types of multi-layer circuit boards.

Figure 1:
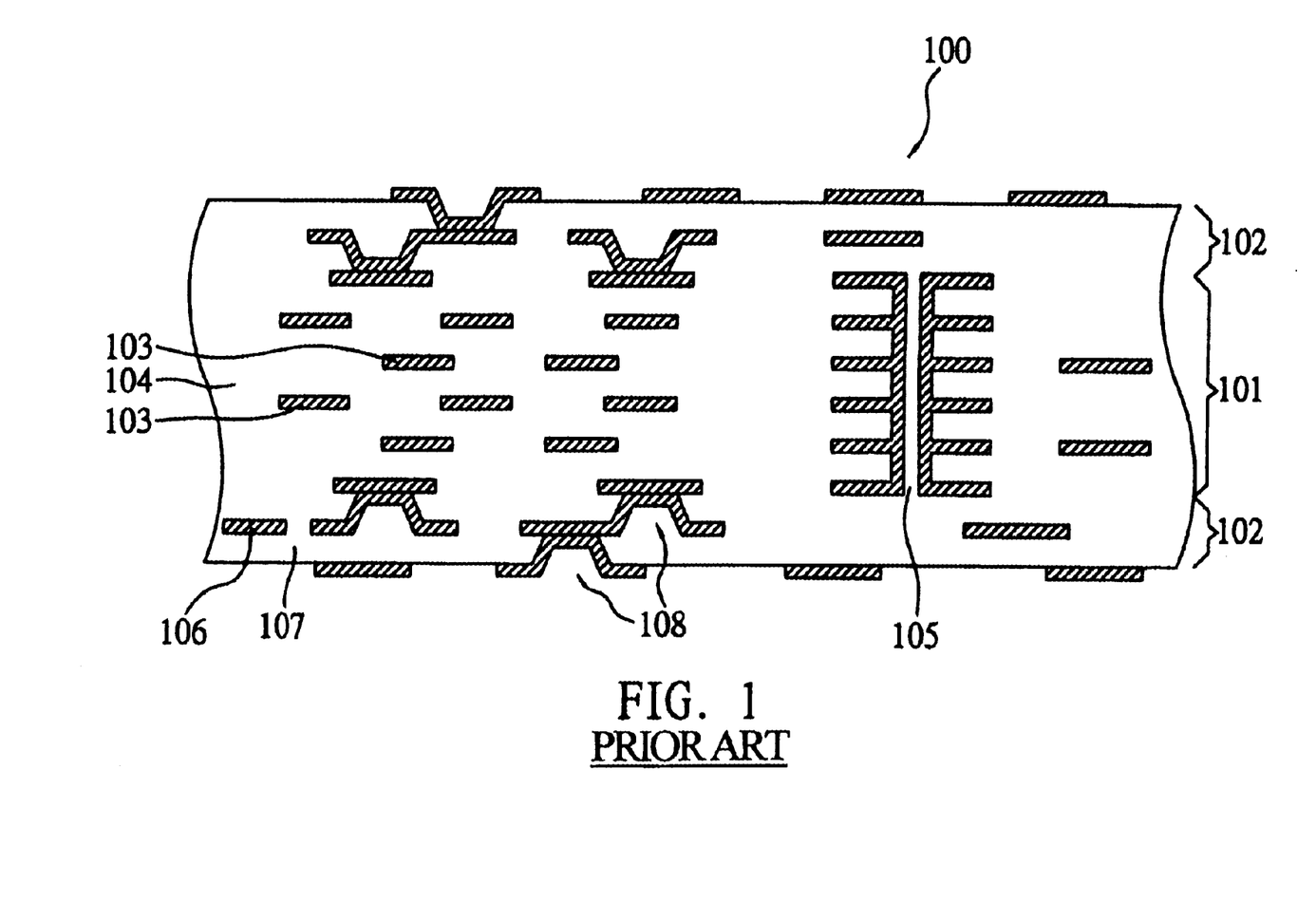
FIG. 1 (PRIOR ART) is a schematic diagram showing a multilayer printed circuit board using a conventional build-up technology.
Figure 2:
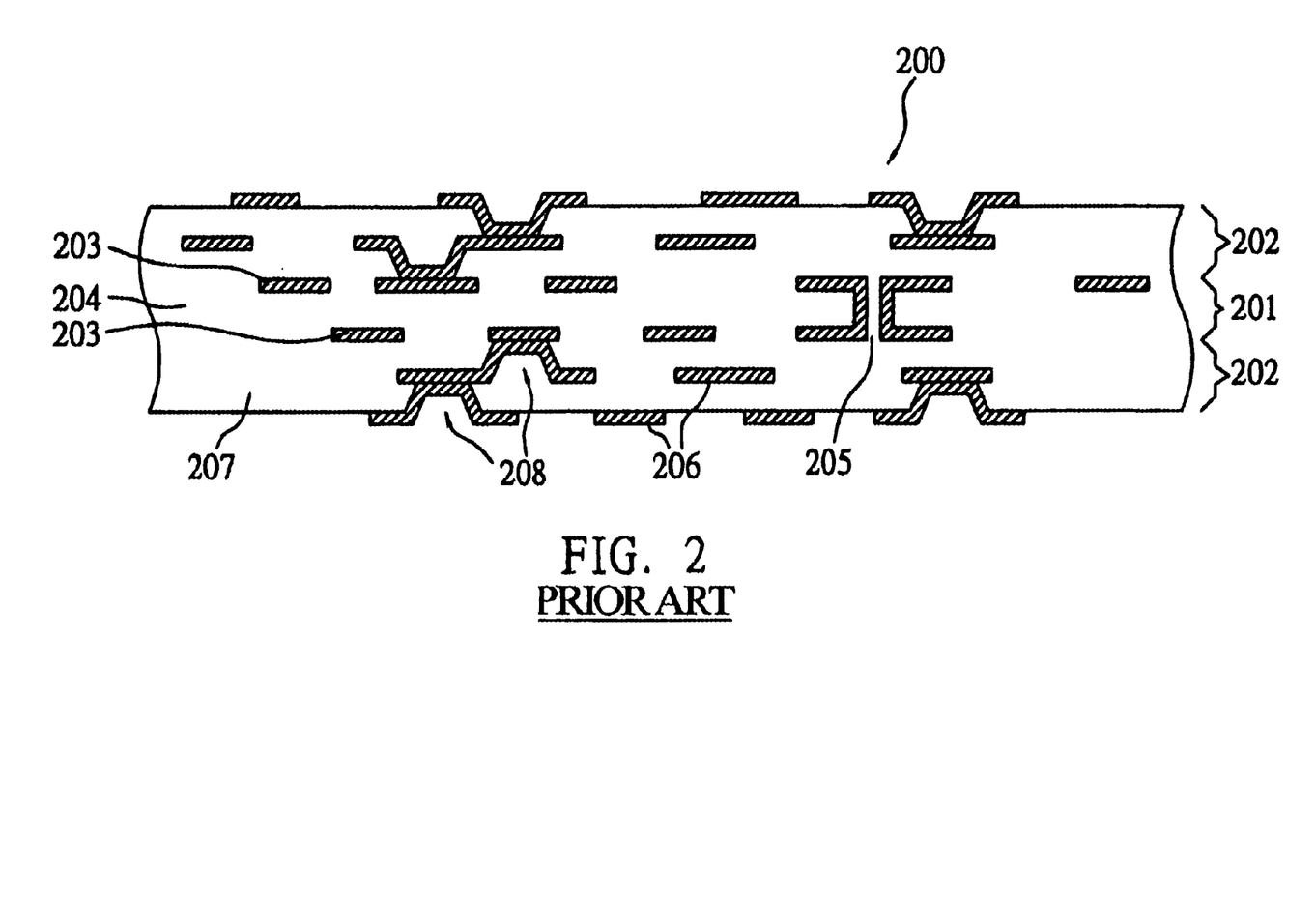
FIG. 2 (PRIOR ART) is a schematic diagram showing another multilayer printed circuit board using a conventional build-up technology.

Commonly, manufacturing a build-up circuit board would require a core substrate which can be single sided, double sided or even multilayer, with a plurality of circuits formed on the surface. FIG. 1 and FIG. 2 are schematic views showing a conventional build-up multilayer printed circuit board. Referring to FIG. 1, a multilayer printed circuit board 100 comprises a core substrate 101 and two build-up layers 102. The core substrate 101 further comprises a plurality of conductive circuit layers 103 disposed thereon and a plurality of insulating layers 104 each of which is interposed between any two conductive circuit layers 103. A conductive through hole 105 is provided for electrically connecting between each of the conductive circuit layers 103. The build-up structure 102 further comprises a plurality of conductive circuit layers 106 and insulating layers 107 which are both much thinner than the conductive circuit layers 103 and insulating layers 104 of the core substrate 101. The conductive circuit layers 106 of the build-up structure 102 are electrically connected by vias 108. Regarding to FIG. 1, the core substrate 101 is a multilayer printed circuit board (i.e. six layers) and the build-up structure 102 has two build-up layers each on the top side and the bottom side.

FIG. 2 is a schematic view of another conventional build-up and multilayer circuit board in which a build-up multilayer printed circuit board 200 comprises a printed circuit board 201 as a core substrate and two build-up structures 202. The printed circuit board 201 comprises two conductive circuit layers 203 and an insulating layer 204 interposed between the two conductive circuit layers 203, and a conductive through hole 205 is also provided for electrically connecting between the two conductive circuit layers 203. The build-up structure 202 also comprises conductive circuit layer 206 and insulating layers 207 in which the conductive circuit layers 206 in the build-up structure are electrically connected by vias 208.

Figure 3A:
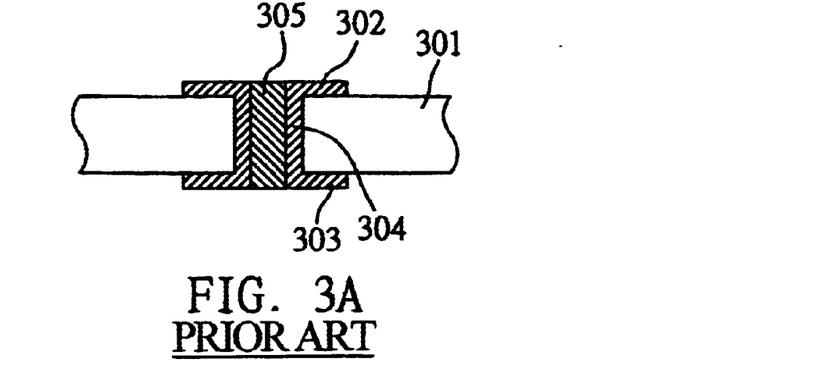
FIG. 3A (PRIOR ART) is a schematic diagram showing a conventional plated through hole structure.
Figure 3B:
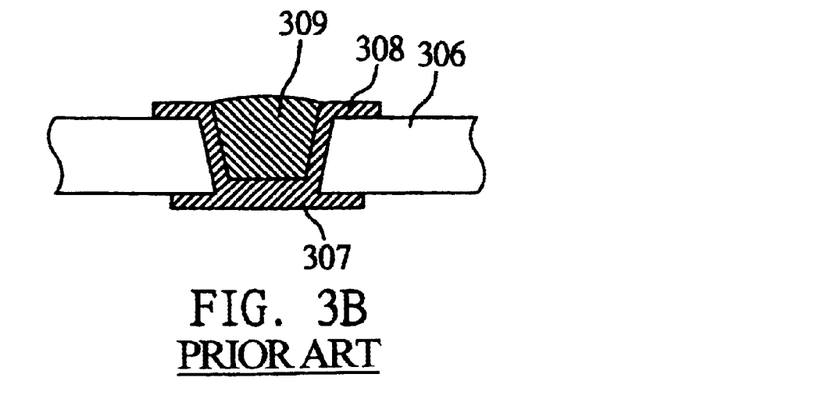
FIG. 3B (PRIOR ART) is a schematic diagram showing a conventional blind via structure in which the concave cavity is filled with fillers after a plated layer is settled.
Figure 3C:
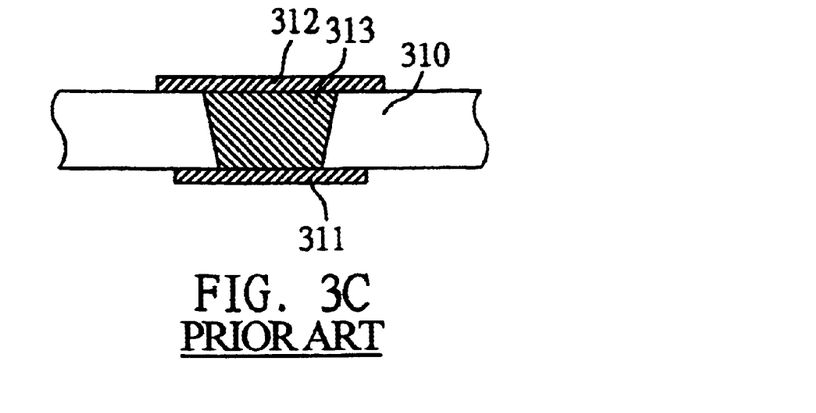
FIG. 3C (PRIOR ART) is a schematic diagram showing a conventional blind via structure, which is completely filled with conductive materials.

Presently, there are 3 common methods for manufacturing vias or through holes in the industries, which are illustrated in FIG. 3A to FIG. 3C. FIG. 3A is a schematic view showing a plated through hole (PTH) in which the opening extends through the insulating layer 301 and the conductive circuit layers 302 and 303 and a metal layer 304 is plated on the side wall of the through hole. After plating, the gap of the through hole is filled with a conductive material or a dielectric material 305 to ensure reliability of the through hole.

Alternatively, FIG. 3B illustrates a so-called blind via of which the opening extends to the inner side of the insulating layer 306 just before reaching to the conductive circuit layer 307. After plating layer 308 is settled, the concave cavities are filled with a conductive material or a dielectric material 309 to achieve quality assured planarity.

FIG. 3C illustrates a third method of making through holes or vias, in which an opening of a blind via is extended through the insulating layer 310 just before reaching to the conductive circuit layer 311. After conductive materials 313 are filled into the via, a conductive circuit layer 312 is then formed.

For the above-mentioned three methods, it is required a filler to fill the gaps of the through holes or vias. However, when the diameter of a hole is below 0.05 mm, the manufacturing process will become substantially difficult for implementation. Therefore, often in large scale production, the process is implemented preferably when the diameters of through holes are larger than 0.75 mm. This thereby limits the design of printed circuit boards, to be even more highly dense.

Figure 4A:
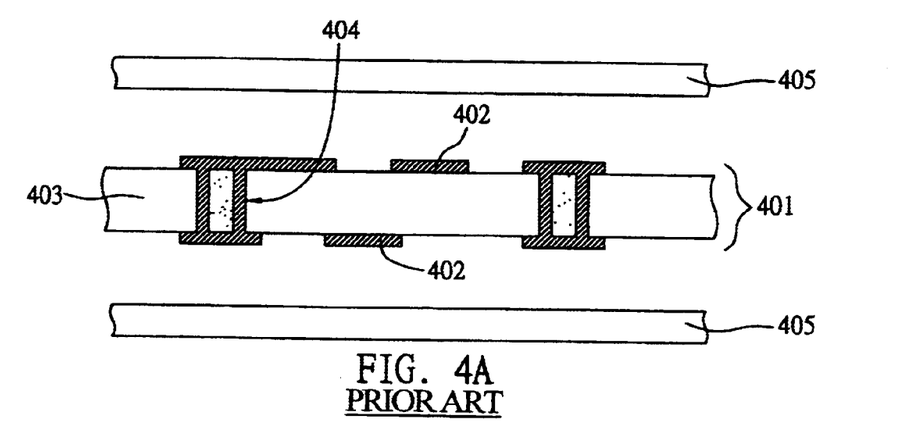
FIG. 4A to FIG. 4E (PRIOR ART) are a series of schematic diagrams showing manufacturing process of a conventional semi-additive process for making finer circuits.
Figure 4B:
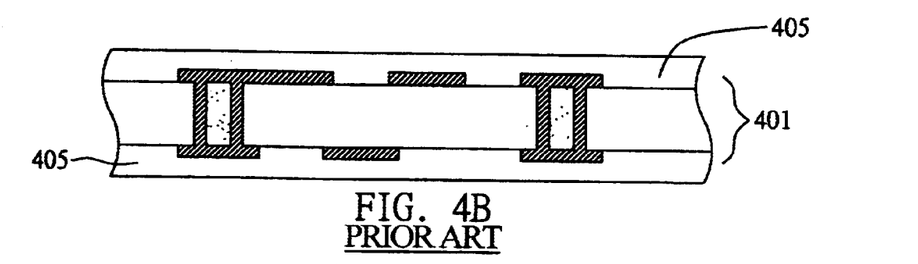

Comparing to conventional subtractive etching process, currently the industries use an additive process to manufacture even finer traces as to manufacture high-density printed circuit board. Typically, this is achieved by electroless plating Copper to a dielectric printed circuit bard to form a seed layer, and then directly forming conductive circuit layer on the dielectric layer. This method can be further divided into full-additive process and semi-additive process. A typical manufacturing process of this semi-additive process for manufacturing finer traces is illustrated in FIG. 4 herein. Referring firstly to FIG. 4A, a core printed circuit board 401 comprises a plurality of conductive circuit patterns 402 and insulating layers 403 interposed between the two conductive circuit layers 402, and a plated conductive through hole 404 for forming electrical connection between the conductive circuit layers. It is further provided with two organic dielectric layers 405 which are vacuum pressed to the surface of the core printed circuit board 401, as shown in FIG. 4B.

Figure 4C:
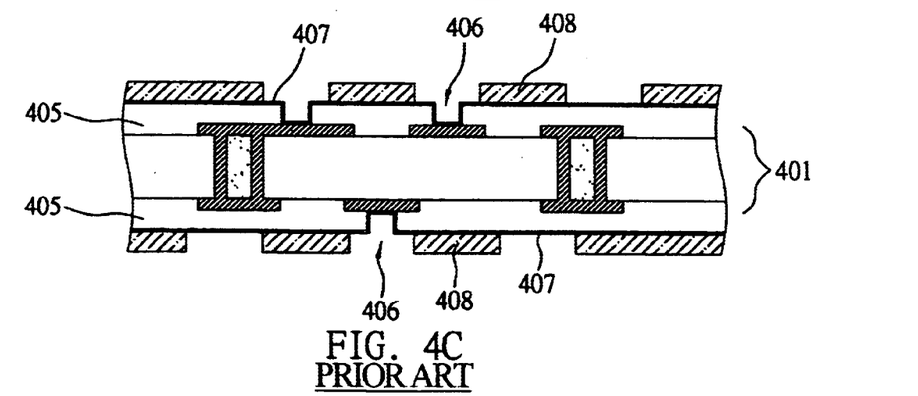
Figure 4D:
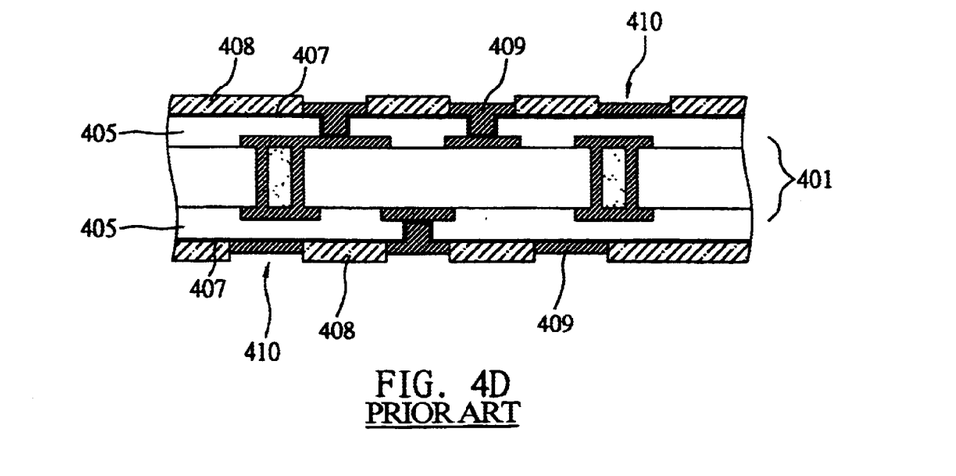
Figure 4E:
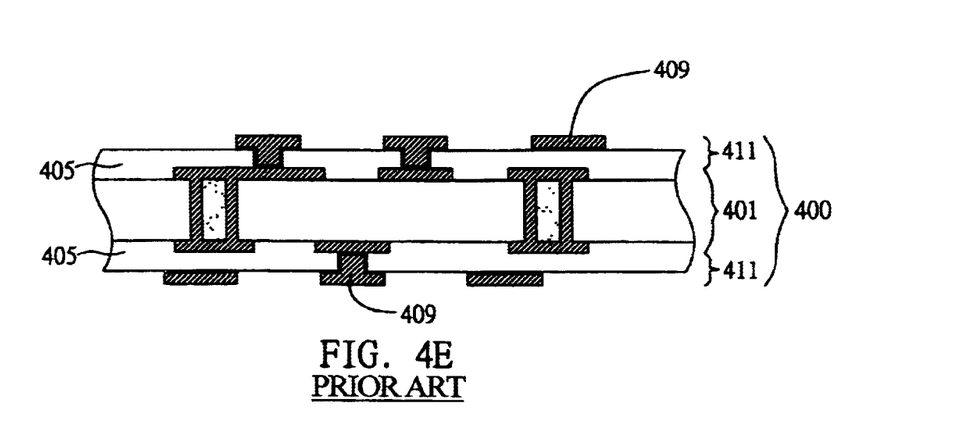

Then, referring now to FIG. 4C, a plurality of blind vias 406 are formed on the organic dielectric layers 405, and a electroless Copper plating layer 407 with a patterned resist layer 408 formed thereon is also formed on the surface of the organic dielectric layer 405. As shown in FIG. 4D, a conductive circuit layer 409 is subsequently formed in an opening 410 of the resist layer 408 by means of an electroplating method. Then after the removal of the resist layer 408 and parts of the electroless Copper plating layer 407, the formation of a build-up, 4 layered printed circuit board 400 is completed, which comprises a core substrate 401, and two build-up structures 411. The build up structure 411 further comprises an organic dielectric layer 405 and a conductive circuit layer 409, wherein the conductive circuit layer 409 is formed by a conventional circuit formation semi-additive process.

By using this process, the traces dimension on the substrate are processed down to 20 to 30 $\mu$m, which are compatible in the use of high functional chips or packages. However, if it is desired to further improve the traces dimension to even smaller scales, there will be manufacturing precision problems that cannot be overcome. Moreover, before the formation of conductive circuit layer, the insulating layer must undergo a surface roughening process, for increasing the bonding ability between the surface of insulating layer 405, electroless Copper plating layer 407, and resist layer 408. However this surface roughening process cannot be easily controlled and is particularly true for the substrate with fine circuits because as the effective bonding surface between the fine circuits and the insulating layer is largely reduced, the level of surface roughening must be increased to accommodate the reduced bonding capability which makes the overall manufacturing process more difficult. In addition, when drilling a hole, it is very likely to create a large amount of resin residues, which is a major cause of poor electrical connection between the conductive vias and traces after electroplating. This subsequently causes a disastrous effect or even leads to traces breaking, and as a result making the manufacturing process for the substrate more difficult and lowering the overall yield.

SUMMARY OF THE INVENTION

In order to overcome the drawbacks of the above-mentioned conventional techniques, a major objective of the present invention is to provide a substrate with stacked vias and fine circuits thereon, and a method for manufacturing the substrate.

Another objective of the present invention is to provide a substrate with stacked vias and fine circuits thereon for preventing the difficulties caused by surface roughening of the insulating layer surface during a conventional manufacturing process for making a substrate, so as to form a high density circuit layer.

Further another objective of the present invention is to provide a substrate with stacked via and fine circuits thereon for preventing the occurrence of resin residues formed in the opening of the holes during hole drilling and thereby solving the problem of poor electrical connection between the hole and the inner conductor or even wire breaking problem.

In order to achieve the foregoing objectives, the present invention provides a manufacturing process of making a substrate with stacked vias and fine circuits thereon, comprising the steps of:

firstly preparing a core substrate having an upper surface, an opposing lower surface, at least one conductive through hole, and a metal layer formed on each side of the core substrate;

at least a first insulating layer is applied over the metal layer and selectively formed with at least a first opening for exposing the metal layer underneath the first insulating layer;

then a metal layer is formed within the first opening by an electroplating method;

using a build-up process to apply at least one second insulating layer over the first insulating layer and selectively forming with a plurality of second openings, wherein the metal layer underneath the second insulating layer is exposed to at least one second opening;

after a conductive layer is applied over the surface of the second insulating layer and the bottom end of the second openings, a metal layer is formed within the second opening by an electroplating method; and finally, the conductive layer is removed by micro-etching to obtain the substrate with stacked vias and fine circuits thereon.

The substrate with stacked vias and fine circuits thereon disclosed in the present invention has only one surface of the core substrate being treated with build-up process, resulting an unsymmetrical structure. A surface roughening process is not required between the insulating layer and conductive circuit layer. Moreover, there is provided a photoimageable polymer, such as epoxy or polyimide as photoimageable insulating layer which is formed with a plurality of openings by using photolithography process, so as to prevent the occurrence of large amount of resin residues which causes poor electrical connection between the conductive vias and traces after electroplating or even generates traces breaking problem. The high density conductive circuit layer with fine circuits is then formed as a whole by assembling the conductive circuit layer on the lower surface of the core substrate and the through holes formed within the core substrate, together with the conductive vias and traces formed in the opening of a photoimageable insulating layer on the upper surface of the cores substrate.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENTS

The foregoing objectives and advantages of the invention can be more fully understood by reference to the following detailed descriptions when taken in conjunction with the accompanying drawings. It is certain that the invention can be exemplified by using various other typed embodiments. The following preferred embodiments are only used for illustrating the invention and therefore should not limit the scope of the invention.

FIG. 5A to FIG. 5J illustrates the manufacturing method for making a multilayer printed circuit board in accordance with a preferred embodiment of the invention, which comprises a multilayer printed circuit board with the application of build-up process on surface of the core substrate for making an unsymmetrical multilayer printed circuit board.

Figure 5A:
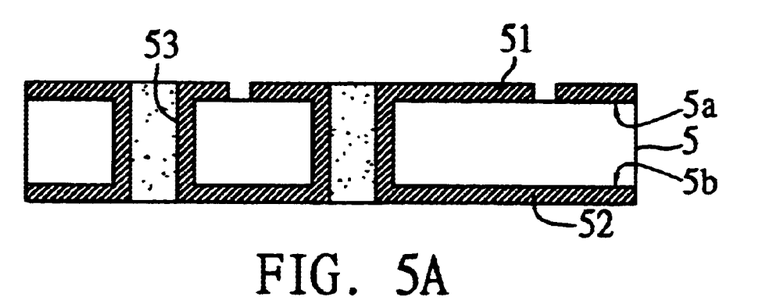
FIG. 5A to FIG. 5J are a series of schematic diagrams showing a manufacturing process for making a substrate with stacked fine vias and fine circuits in the present invention.

As shown in FIG. 5A, a core substrate 5 having an upper surface 5a and an opposing lower surface 5b is firstly provided in which a patterned first conductive circuit layer 51 and a metal layer 52 is formed on the top 5a and lower surface 5b respectively. Moreover, the core substrate 5 further comprises at least one conductive through hole 53 for providing electrical connection between the conductive circuit layers and metal layer.

Figure 5B:
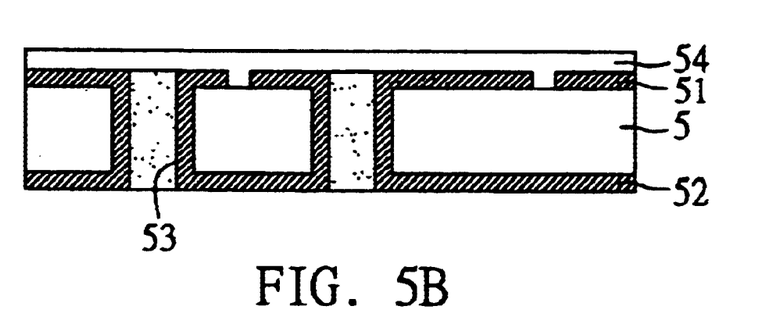

As shown in FIG. 5B, there is formed a first photoimageable insulating layer 54 on the upper surface 5a of the core substrate 5.

Figure 5C:
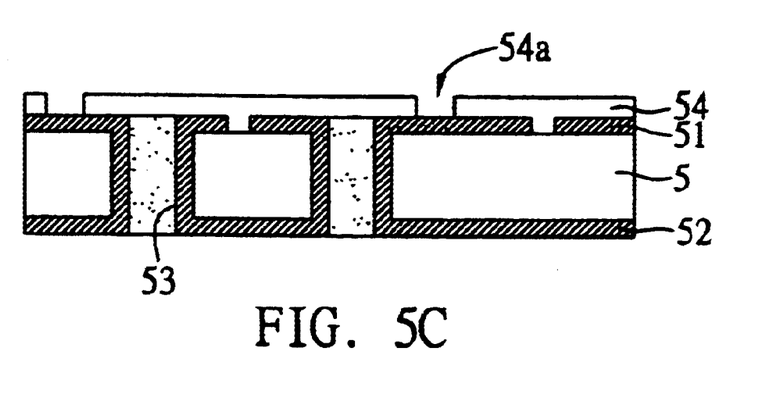

As shown in FIG. 5C, at least one first opening 54a is selectively formed by either treating the first photoimageable insulating layer 54 with photolithography technology following by processes such as exposure and development, or laser via technology allowing the first conductive circuit layer 51 to be exposed to the first opening 54a. The photoimageable insulating layer 54 can be made of a photoimageable polymer such as epoxy or polyimide, using photolithography process to form openings. Otherwise, a thermosetting resin also could be used as an insulating layer by means of a laser-via technology to form openings. However, the openings are most preferably formed using photolithography process.

Figure 5D:
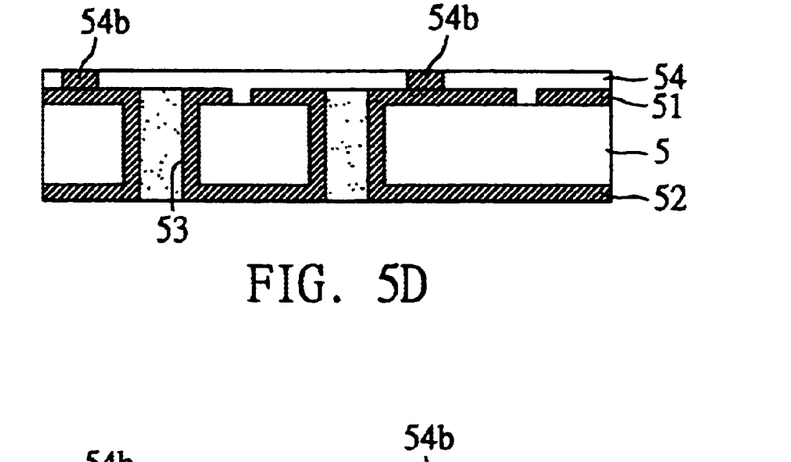

Referring then to FIG. 5D, a metal layer 54b made by Copper for example is formed within the first opening 54a by an electroplating method. This electroplating method is performed via the metal layer 52 on the lower surface of the core substrate 5, the conductive through holes 53 and the first conductive circuit layer 51 on the upper surface of the core substrate 5 which act together as an electrical conducting path as a whole for forming a metal layer 54b in the first opening 54a.

Figure 5E:
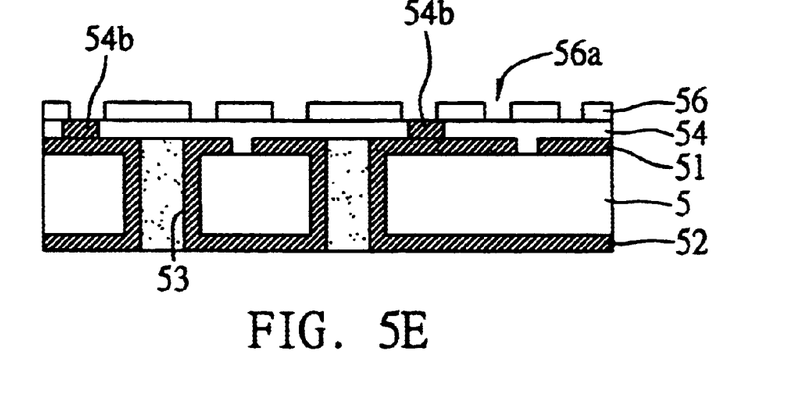

As shown in FIG. 5E, a build-up process is used to apply the second photoimageable insulating layer 56 over the first photoimageable insulating layer 54, and selectively forming a plurality of second openings 56a with the second photoimageable insulating layer 56 in which at least one second openings 56a are exposed to the metal layer 54b underneath the second photoimageable insulating layer 56. The mentioned second openings 56a can act as the opening of the conductive circuits or the vias and the second photoimageable insulating layer 56 can be made of the same material as the first photoimageable insulating layer 54.

Figure 5F:
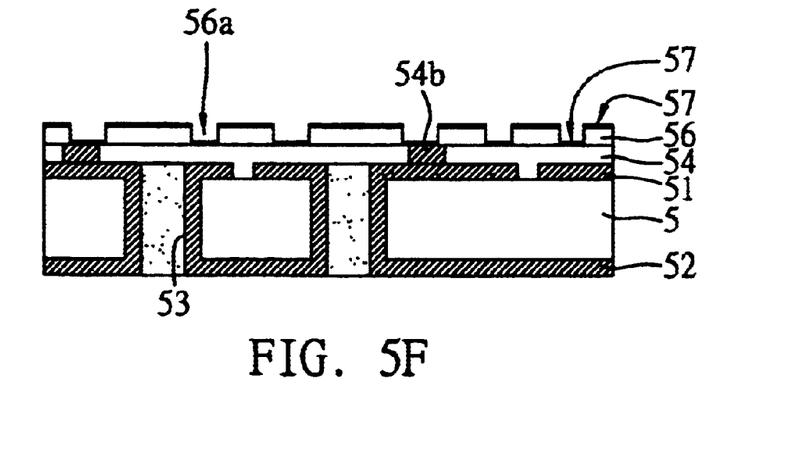

As shown in FIG. 5F, a selective metal conductive layer 57 is formed on the surface of the second photoimageable insulating layer 56 and the bottom end of the second openings 56a. This conductive layer 57 is used for providing an electrical conducting path for the later electroplating process. The conductive layer 57 can be made of electrically conductive metals or alloys. The metals can be selected from a group consisting of Copper, Nickel, Chromium, Tin, and Titanium while the alloys can be selected from a group consisting of Copper-Chromium alloy, Tin-Lead alloy.

Figure 5G:
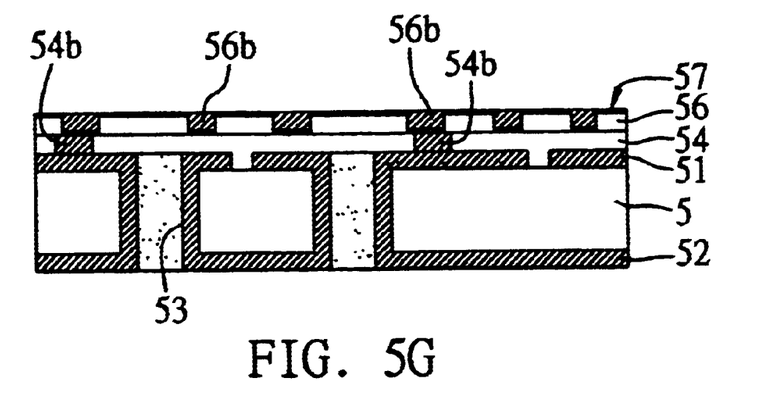

As shown in FIG. 5G, further a metal layer 56b made by Copper for example is formed within the second openings 56a by an electroplating method. This metal layer 56b is then used for electrically connecting the conductive traces or vias of the substrate with the above-mentioned metal layer 54b.

Figure 5H:
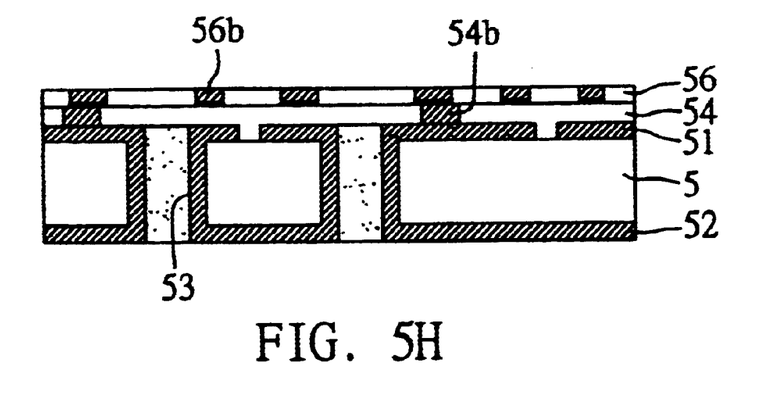
Figure 5I:
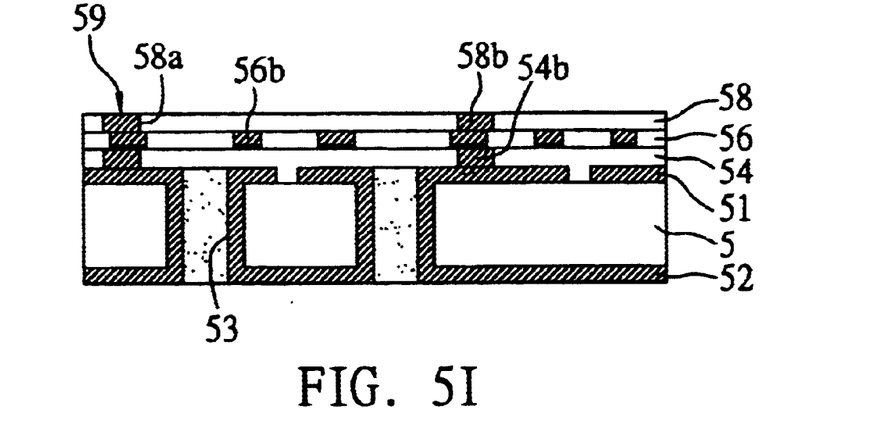

As shown in FIG. 5H, after the metal layer 56b is formed in the second openings, the metal conductive layer 57 applied over the second photoimageable insulating layer 56 is then removed by micro-etching the substrate surface, allowing the planarity of both the surface of the metal layer 56b and the surface of the second photoimageable insulating layer 56 can be maintained.

Likewise, as shown in FIG. 5H, a third photoimageable insulating layer 58 is applied over the second photoimageable insulating layer 56 and is selectively formed with at least one third opening 58a, which use photolithography process. The third opening 58a can act as the opening of the conductive traces or vias for exposing the metal layer 56b of the third photoimageable insulating layer 58 to the third opening 58a. After a metal layer 58b is formed in the third opening 58a by electroplating process, a core substrate 5 with stacked vias 59 is formed.

Figure 5J:
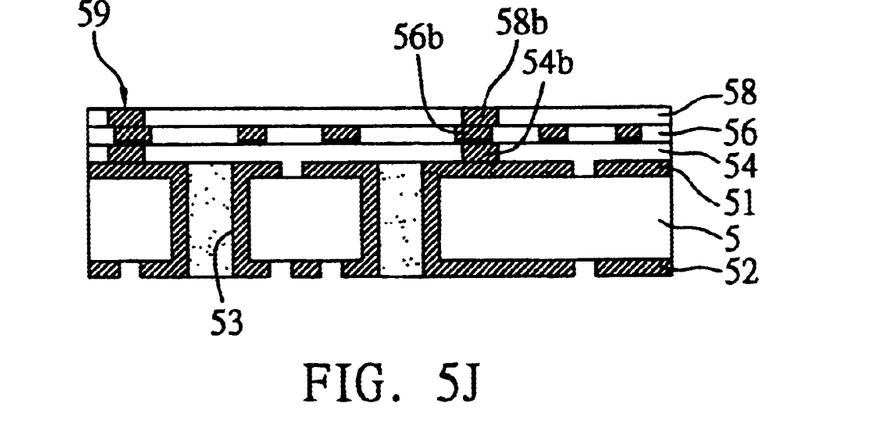

As shown in FIG. 5J, a photolithography process is applied on the metal layer 52 to obtain a semiconductor packaging substrate with stacked vias and fine circuits.

The substrate with stacked vias and fine circuits of the invention has only one surface of the core substrate 5 being treated with build-up process, resulting an unsymmetrical structure. Moreover, there is provided a photoimageable insulating layer 54, 56, 58 which is formed with a plurality of openings by using photolithography process, so as to prevent the occurrence of large amount of resin residues which causes poor electrical connection between the conductive vias and traces after electroplating or even generates trace breaking problem. The high density conductive circuit layer with fine circuits is then formed as a whole by assembling the conductive circuit layer on the lower surface of the core substrate and the through holes formed within the core substrate, together with the conductive vias and conductive traces formed in the opening of a photoimageable insulating layer on the upper surface of the cores substrate, without the need for surface roughening process between the insulating layer and the conductive circuit layer.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a substrate with stacked vias and fine circuits, comprising:

preparing a core layer having an upper surface with a patterned circuit layer and an opposing lower surface with a metal layer and having at least one conductive through hole for providing electrical connection between the circuit layer and the metal layer;

applying at least one first insulating layer over the circuit layer and selectively forming at least one first opening in the first insulating layer for exposing a portion of the circuit layer underneath the first insulating layer, so as to allow a metal layer to be formed within the first opening by an electroplating process;

applying at least one second insulating layer over the first insulating layer and selectively forming a plurality of second openings in the second insulating layer, wherein at least one of the second openings allows the metal layer formed within the first opening to be exposed;

forming a selective conductive layer on the second insulting layer and within the second openings;

forming a metal layer on the conductive layer in the second openings by an electroplating process; and micro-etching the conductive layer on the second insulting layer to obtain the substrate with stacked vias and fine circuits formed thereof.

2. The method of claim 1, wherein each of the first and second insulating layers is a photoimageable insulating layer.

3. The method of claim 2, wherein the photoimageable insulating layer is selectively formed with at least one opening using a photolithography process.

4. The method of claim 2, wherein the photoimageable insulating layer is made of photoimageable polymer.

5. The method of claim 1, wherein the conductive layer is made of a material selected from the group consisting of Copper, Tin, Nickel, Chromium, Titanium, Copper-Chromium alloy, and Tin-Lead alloy.

* * * * *